(12) United States Patent
Oms

(10) Patent No.: US 11,726,125 B2
(45) Date of Patent: Aug. 15, 2023

(54) SYSTEM FOR DETECTING FAULTS IN ELECTRICAL CABLING

(71) Applicant: Airbus Operations (S.A.S.), Toulouse (FR)

(72) Inventor: Patrick Oms, Toulouse (FR)

(73) Assignee: Airbus Operations (S.A.S.), Toulouse (FR)

( * ) Notice: Subject to any disclaimer, the term of this patent is extended or adjusted under 35 U.S.C. 154(b) by 0 days.

(21) Appl. No.: 17/461,545

(22) Filed: Aug. 30, 2021

(65) Prior Publication Data
US 2022/0099759 A1 Mar. 31, 2022

(30) Foreign Application Priority Data
Sep. 29, 2020 (FR) ...................................... 2009873

(51) Int. Cl.
*G01R 31/00* (2006.01)
*B64F 5/60* (2017.01)
(Continued)

(52) U.S. Cl.
CPC ........... *G01R 31/008* (2013.01); *B64D 41/00* (2013.01); *B64F 5/60* (2017.01); *G01R 31/52* (2020.01);
(Continued)

(58) Field of Classification Search
CPC ............. G01R 3/58; G01R 3/52; G01R 27/14
See application file for complete search history.

(56) References Cited

U.S. PATENT DOCUMENTS

| 5,986,860 A * | 11/1999 | Scott ...................... G01R 31/52 |
| | | 361/45 |
| 7,023,217 B1 * | 4/2006 | Wong ..................... G01R 31/58 |
| | | 324/424 |

(Continued)

FOREIGN PATENT DOCUMENTS

| EP | 3 361 587 A1 | 8/2018 |
| EP | 3 399 612 A1 | 11/2018 |

(Continued)

OTHER PUBLICATIONS

FR3054858A1—Espacenet Translation accessed Sep. 30, 2022—https://worldwide.espacenet.com/patent/ (Year: 2022).*
(Continued)

*Primary Examiner* — Lina Cordero
(74) *Attorney, Agent, or Firm* — KDW Firm PLLC

(57) ABSTRACT

A main electrical cabling is subject to variations in ambient temperature over its length. A detection system for detecting a fault in the main electrical cabling able to cause a serial arc, or heating within a connection, includes a monitor electrical cabling placed alongside the main electrical cabling and a controllable current generator injecting, at the input of the monitor electrical cable, a current proportional to the current flowing through the main electrical cabling. The main and monitor sets of electrical cabling being joined at the output, an electronic circuitry measures the difference between the electrical potential at the input of the main electrical cabling and that at the input of the monitor electrical cabling and detects a fault in the main electrical cabling when the difference of the electrical potentials exceeds a predefined threshold. A fault in the main electrical cabling is detected despite the variations in temperature.

8 Claims, 4 Drawing Sheets

(51) Int. Cl.
  *G01R 31/58* (2020.01)
  *B64D 41/00* (2006.01)
  *H02H 1/00* (2006.01)
  *H02H 3/20* (2006.01)
  *G01R 31/52* (2020.01)

(52) U.S. Cl.
  CPC ........... *G01R 31/58* (2020.01); *H02H 1/0007* (2013.01); *H02H 3/20* (2013.01); *B64D 2221/00* (2013.01)

(56) References Cited

U.S. PATENT DOCUMENTS

| | | | |
|---|---|---|---|
| 11,016,133 B2* | 5/2021 | Peralta | G01R 31/008 |
| 2001/0029433 A1 | 10/2001 | Scott | |
| 2003/0206111 A1 | 11/2003 | Gao et al. | |
| 2009/0187358 A1 | 7/2009 | Deaver, Sr. | |
| 2014/0209742 A1* | 7/2014 | Guering | H05K 7/02 244/119 |
| 2016/0216318 A1* | 7/2016 | Zhang | G01R 31/2818 |
| 2018/0323602 A1* | 11/2018 | Oms | G01R 31/52 |
| 2018/0348280 A1* | 12/2018 | Collins | H02H 1/0007 |
| 2020/0191853 A1* | 6/2020 | Peralta | G01R 31/085 |
| 2020/0191856 A1* | 6/2020 | Peralta | G01R 31/52 |
| 2021/0107279 A1* | 4/2021 | Anderson | B41J 2/04541 |
| 2022/0099724 A1 | 3/2022 | Oms | |

FOREIGN PATENT DOCUMENTS

| | | | | |
|---|---|---|---|---|
| EP | 3 457 510 A1 | 3/2019 | | |
| EP | 3 483 999 A1 | 5/2019 | | |
| EP | 3 667 340 A1 | 6/2020 | | |
| EP | 3974854 A1 | 3/2022 | | |
| EP | 3974855 A1 | 3/2022 | | |
| FR | 2973884 A1 * | 10/2012 | ........... | G01R 31/008 |
| FR | 3054858 A1 * | 2/2018 | ................ | F02C 7/14 |
| GB | 2 541 026 A | 2/2017 | | |
| WO | WO 2020/074128 A1 | 4/2020 | | |

OTHER PUBLICATIONS

FR2973884A1—Espacenet Translation accessed Sep. 30, 2022—https://worldwide.espacenet.com/patent/ (Year: 2022).*
European Search Report for Application No. 21181698 dated Nov. 10, 2021.
European Search Report for Application No. 21181702 dated Nov. 10, 2021.
French Search Report for Application No. 2009873 dated May 21, 2021.

* cited by examiner

SYSTEM FOR DETECTING FAULTS IN ELECTRICAL CABLING

CROSS-REFERENCE TO RELATED APPLICATION

This application claims priority to French patent application number 20 09873 filed on Sep. 29, 2020, the entire disclosure of which is incorporated by reference herein.

TECHNICAL FIELD

The disclosure herein relates to a system for detecting faults in electrical cabling. The disclosure herein is notably applicable in the field of aeronautics.

BACKGROUND

An electrical installation comprises power supply cabling which may reach several tens of meters. Cabling is understood to mean the power supply cables together with any electrical connections between these power supply cables. Along these power supply cables, the environmental conditions may be different. For example, in an aircraft, electrical cabling connects an electrical generator at the outlet of a turbojet, typically on one of the wings of the aircraft, and an electrical power supply system, for example an electrical power distribution center in the area of the cockpit of the aircraft. This electrical cabling is subject to variations in environmental conditions, more particularly in temperature, over its length. These variations may be significant in view of the cabling area being considered (on the wings and depending on whether this area is close or not to the turbojet, in the pressurized cabin, etc.), in view of the phase of operation of the aircraft (on the ground, in flight) and in view of the meteorological conditions (time of day, season, region of the world, etc.). An increase in temperature of the electrical cabling may also be noted that is linked to the resistive heating induced by the passage of current within the electrical cabling.

In the case of wear of an electrical cable or of an electrical connection fault in the electrical cabling, a serial arc or significant local increase in temperature at a connection may occur. The formation of an electrical arc is typically detected by virtue of circuit breakers, which is particularly effective with respect to parallel arcs, but these circuit breakers cannot detect the formation of a serial arc (because the current does not increase). The variations in temperature along the electrical cabling render a potential measurement of the voltage drop, between the start at the electrical generator and the arrival at the electrical power distribution center, insignificant because the temperature affects the resistance of the electrical cables. For example, the resistance of copper varies by 100% over the temperature range from −40° C. to +150° C., which may, for the same intensity of current, lead to a voltage difference of 10 Volts, or even 20 Volts, in an electrical supply cable in an aircraft. Since a voltage drop associated with the formation of a serial arc or an increase in resistance of a connection is of the same order of magnitude, the detection of the fault in the electrical cabling is not therefore possible by a simple measurement of the voltage drop because of the aforementioned variations in temperature. Although the danger from serial arcs is less than that from parallel arcs, it is desirable to be able to detect in a pre-emptive manner faults in electrical cabling leading to the formation of serial arcs or increase in connection resistance, notably in an aircraft electrical installation, in such a manner as to anticipate maintenance operations.

SUMMARY

For this purpose, a detection system is provided for detecting, in a Direct Current (DC) electrical installation, a fault in an electrical cabling, referred to as main electrical cabling, of cross-section S1, the main electrical cabling being installed such that it is subject to variations in ambient temperature over its length.

According to a first embodiment, the detection system comprises: another electrical cabling, referred to as monitor electrical cabling, designed to be placed alongside the main electrical cabling, of same length as the main electrical cabling, of same composition and of cross-section S2 less than the cross-section S1; a controllable current generator injecting, at the input of the monitor electrical cable, a current I2 substantially equal to a current I1 flowing through the main electrical cabling multiplied by an attenuation gain equal to the ratio S2/S1, the main electrical cabling and the monitor electrical cabling being joined at the output; and an electronic circuitry arranged for comparing the electrical potential at the input of the main electrical cabling and the electrical potential at the input of the monitor electrical cabling, and for detecting a fault in the main electrical cabling when the difference of the electrical potentials exceeds a predefined threshold. Thus, a fault in the main electrical cabling leading to a serial arc or an increase in temperature of a connection is detected despite the variations in temperature.

According to one embodiment, the detection system comprises a current probe measuring the intensity of the current I1, and in which the electronic circuitry comprises: an attenuator controlling the controllable current generator as a function of the intensity of the current I1 measured by the current probe; a differential amplifier for measuring the difference between the electrical potential at the input of the main electrical cabling and the electrical potential at the input of the monitor electrical cabling; and a comparator comparing the output of the differential amplifier with a predefined potential Vref corresponding to the predefined threshold.

According to one embodiment, a low-pass filter is present at the output of the comparator.

An electrical installation is also provided comprising an electrical cabling, referred to as main electrical cabling, the main electrical cabling being designed to be installed in an environment where the main electrical cabling is subject to variations in ambient temperature over its length, and furthermore comprising a detection system such as previously described.

According to one embodiment, the monitor electrical cabling is placed, over its length, against the main electrical cabling.

According to one embodiment, the electrical installation furthermore comprises a circuit breaker and in which the electronic circuitry is arranged for triggering the circuit breaker when the electrical potential at the input of the main electrical cabling and the electrical potential at the input of the monitor electrical cabling exceeds the predefined threshold.

An aircraft is also provided comprising an electrical installation such as described hereinabove, the main electrical cabling being installed in areas of the aircraft subject to different ambient temperatures.

According to one embodiment, the main electrical cabling is installed between an electrical generator installed on a wing of the aircraft at the outlet of a turbojet and an electrical distribution center installed in the pressurized cabin of the aircraft.

According to a second embodiment, the detection system comprises: another electrical cabling, referred to as monitor electrical cabling, of cross-section S2 less than the cross-section S1, designed to be placed as a return loop alongside the main electrical cabling; a monitoring device; a return cable bringing back the electrical potential at the output of the main electrical cabling to the monitoring device. In addition, the monitoring device comprises: a controllable current generator injecting, at the input of the monitor electrical cable, a current I2 equal to a current I1 attenuated by an attenuation factor G1, the current I1 flowing through the main electrical cabling, the controllable current generator being connected between the input and the output of the monitor electrical cabling, the attenuation factor G1 being such that the currents I1 and I2 respectively lead to the same increase in temperature in the main electrical cabling and in the monitor electrical cabling; and an electronic circuitry comprising a first differential amplifier implemented by virtue of an operational amplifier connected to a first input at the input of the main electrical cabling and to a second input at the output of the main electrical cabling, via the return cable, the electronic circuitry being arranged for determining a difference in voltages between the outputs of the first differential amplifier and an adaptation by virtue of a gain G2 of the voltage between the input and the output of the monitor electrical cabling, with G2=S2/(2.G1.S1), and for detecting a fault in the main electrical cabling when the difference in voltages exceeds a predefined margin. Thus, a fault in the main electrical cabling leading to a serial arc or an increase in temperature of a connection is detected despite the variations in temperature.

According to one embodiment, the detection system comprises a current probe measuring the intensity of the current I1, and in which the electronic circuitry comprises: an attenuator controlling the controllable current generator as a function of the intensity of the current I1 measured by the current probe; a second differential amplifier arranged for indicating at the output a value, adapted by virtue of the gain G2, of voltage between the input and the output of the monitor electrical cabling; a third differential amplifier arranged for indicating at the output which difference exists between the voltage at the output of the second differential amplifier and the voltage at the output of the first differential amplifier; and a comparator comparing the output of the third differential amplifier with a predefined potential Vref corresponding to the predefined margin.

According to one embodiment, a low-pass filter is present at the output of the comparator.

An electrical installation is also provided comprising an electrical cabling, referred to as main electrical cabling, the main electrical cabling being designed to be installed in an environment where the main electrical cabling is subject to variations of ambient temperature over its length, and furthermore comprising a detection system such as described hereinabove.

According to one embodiment, the monitor electrical cabling is placed, over its return loop length, against the main electrical cabling.

According to one embodiment, the electrical installation furthermore comprises a circuit breaker and in which the electronic circuitry is arranged for triggering the circuit breaker when the difference in voltages between the output of the first differential amplifier and the adaptation by virtue of a gain G2 of the voltage between the input and the output of the monitor electrical cabling exceeds the predefined margin.

An aircraft is also provided comprising an electrical installation such as described hereinabove, the main electrical cabling being installed in areas of the aircraft subject to different ambient temperatures.

According to one embodiment, the main electrical cabling is installed between an electrical generator installed on a wing of the aircraft at the outlet of a turbojet and an electrical distribution center installed in the pressurized cabin of the aircraft.

BRIEF DESCRIPTION OF THE DRAWINGS

The features of the disclosure herein mentioned hereinabove, together with others, will become more clearly apparent upon reading the following description of one exemplary embodiment, the description being presented in relation with the appended drawings, of which.

DETAILED DESCRIPTION

Figure 1:
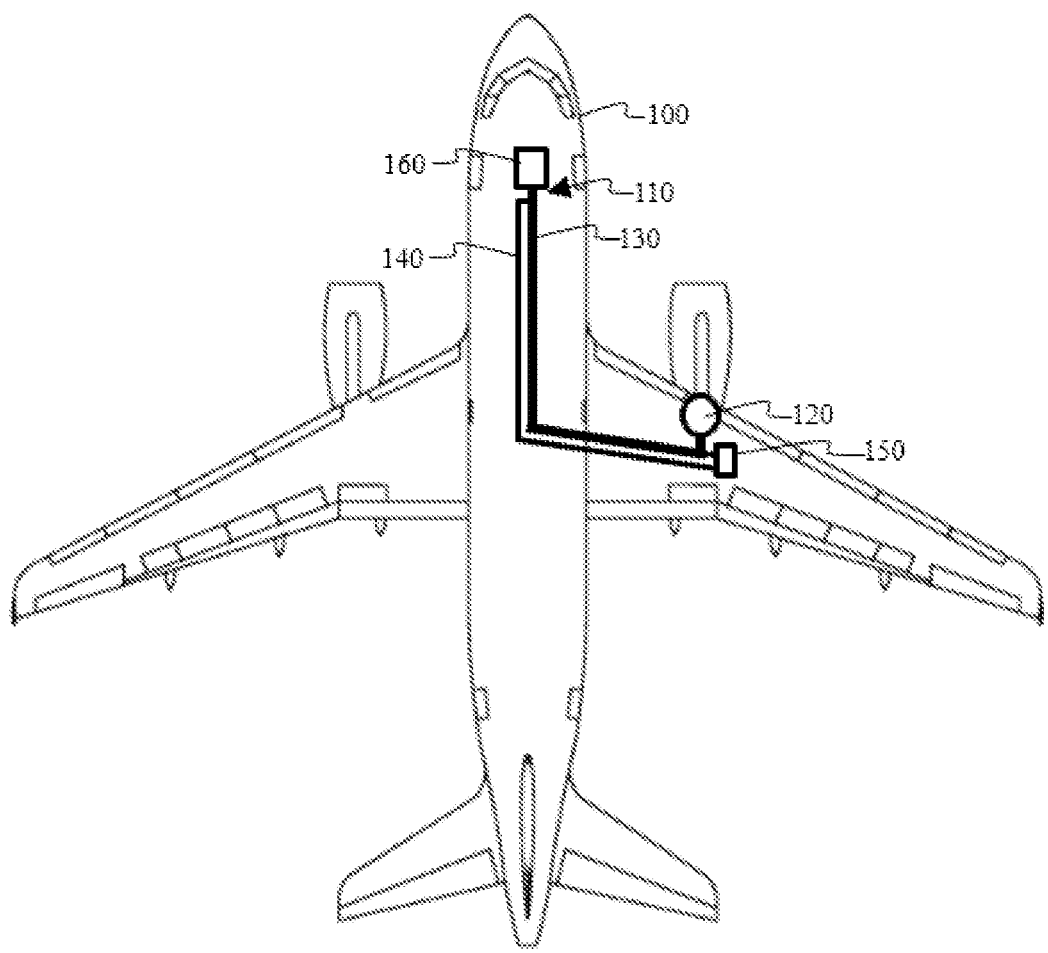
FIG. 1 illustrates schematically, as a top view, an aircraft equipped with an electrical installation comprising a system for detecting faults in electrical cabling according to a first embodiment of the disclosure herein.

FIG. 1 illustrates schematically, as a top view, an aircraft 100 equipped with an electrical installation 110 comprising a system for detecting faults in electrical cabling in the electrical installation 110 according to a first embodiment of the disclosure herein.

The electrical installation comprises an electrical source 120 and an electrical system 160 (typically referred to as load) to be electrically powered by the electrical source 120. The electrical source 120 and the electrical system 160 are connected by virtue of an electrical cabling 130. The electrical cabling 130 comprises at least one electrical supply cable, and potentially furthermore one or more electrical connections.

The electrical installation 110 is subject to variations in temperature along the electrical cabling 130. It is for example considered that the electrical source 120 is an electrical generator at the output (mechanical sampling) of a turbojet of the aircraft 100 and that the electrical system 160 is an electrical distribution center of the aircraft 100. It is furthermore considered in this example that the electrical cabling 130 runs in one of the wings of the aircraft 100, then into the pressurized cabin of the aircraft 100. The electrical cabling 130 thus passes through three areas Z1, Z2, Z3 having different environmental conditions, more particularly in terms of ambient temperature. The area Z1 corresponds to an area of the wing which covers a distance D around the turbojet, the area Z2 corresponds to an area of the wing beyond the distance D, and the area Z3 corresponds to the pressurized cabin of the aircraft 100.

The system for detecting faults in electrical cabling comprises an electrical cabling 140 which runs along the electrical cabling 130, of same length as the latter. The electrical cabling 140 serves as a reference electrical cabling and is installed so as to be subject to the same environmental variations, notably in terms of temperature, as the electrical cabling 130. In the present description, the electrical cabling 130 is called main electrical cable and the electrical cabling 140 is called monitor electrical cabling.

The monitor electrical cabling 140 is of same composition as the main electrical cabling 130. Notably, the electrical cables have conducting cores made of the same alloy. However, the monitor electrical cabling 140 has a cross-section S2 that is smaller than the cross-section S1 of the main electrical cabling 130, thus allowing the weight due to the monitor electrical cabling 140 to be limited. The resistance R2 of the monitor electrical cabling 140 is therefore higher than the resistance R1 of the main electrical cabling 130.

Figure 2:
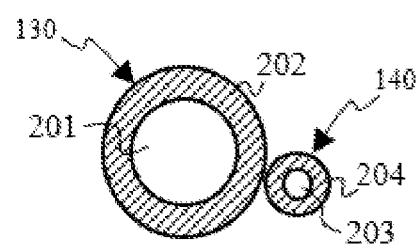
FIG. 2 illustrates schematically a simplified cross-section of one particular arrangement of the electrical cabling in the electrical installation according to a first embodiment of the disclosure herein.

One particular installation of the monitor electrical cabling 140 with respect to the main electrical cabling 130 is shown in FIG. 2. This shows as a simplified cross-section a conducting core 201 (typically made of copper) surrounded by an insulating sheath 202 of the main electrical cabling 130, and a conducting core 203 (typically made of copper) surrounded by an insulating sheath 204 of the monitor electrical cabling 140. In FIG. 2, the monitor electrical cabling 140 is placed, over its length, against the main electrical cabling 130, so as to closely match their increase in temperature associated with resistive heating. For this purpose, the monitor electrical cabling 140 may be attached or bonded to the main electrical cabling 130.

The monitor electrical cabling 140 is connected to the main electrical cabling 130 at the output of the main electrical cabling 130, in other words at the load 160. The monitor electrical cabling 140 and the main electrical cabling 130 therefore have the same electrical potential at their junction point.

The system for detecting faults in electrical cabling furthermore comprises a monitoring device 150 arranged for injecting into the monitor electrical cabling 140 a current I2 proportional to the current I1 injected by the electrical source 120 at the input of the main electrical cabling 130. The current I2 is substantially equal to the current I1 flowing in the main electrical cabling 130 multiplied by an attenuation gain equal to the ratio S2/S1. The monitoring device 150 is furthermore arranged for measuring the difference between the electrical potential at the input of the main electrical cabling 130 (in other words at the electrical source 120) and the electrical potential at the input of the monitor electrical cabling 140, and for detecting a fault in the main electrical cabling 130 when the difference of the electrical potentials exceeds a predefined threshold.

Figure 3:
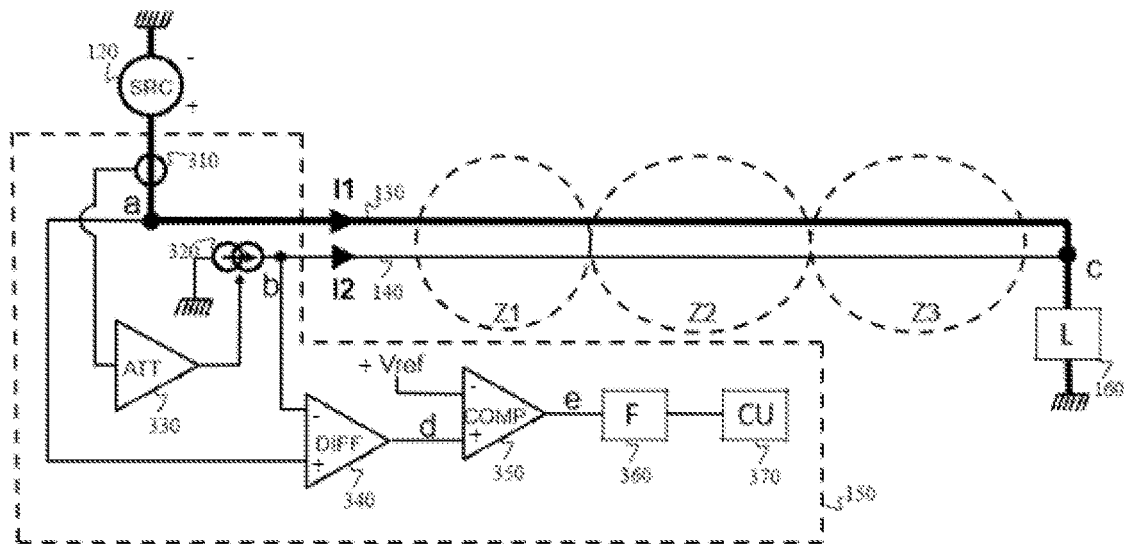
FIG. 3 illustrates schematically an arrangement of the system for detecting faults in electrical cabling in the electrical installation according to a first embodiment of the disclosure herein.

FIG. 3 illustrates schematically one particular embodiment of the system for detecting faults in electrical cabling, and more particularly of the monitoring device 150. FIG. 3 shows the load L 160 connected to the electrical source SRC 120 by virtue of the main electrical cabling 130. A current I1 flows in the main electrical cabling 130. FIG. 3 also shows the monitor electrical cabling 140 installed alongside the main electrical cabling 130, and joined to the main electrical cabling 130 at a point c just upstream of the load L 160. Thus, the heat dissipation due to resistive heating is similar in the two sets of electrical cabling, and hence as are also the variation in resistance and the induced voltage drops. The difference between the voltage drops appearing on the two sets of electrical cabling therefore remains close to 0 Volts (to within a predefined margin) as long as there is no fault in the main electrical cabling 130.

The monitoring device 150 comprises a current probe 310 installed just upstream of the input of the main electrical cabling 130 in order to measure the intensity of the current I1. The monitoring device 150 furthermore comprises an attenuator ATT 330 responsible for controlling a controllable current generator 320 at the input of the monitor electrical cabling 140 as a function of the intensity of the current I1 measured by the current probe 310. The attenuator ATT 330 has a gain $G1=R1/R2=S2/S1$. Thus a current $I2=G1.I1$ in the monitor electrical cabling 140. Thus, in the absence of a fault on the main electrical cabling 130, the voltage Uac between the input a of the main electrical cabling 130 and the aforementioned junction point c and the voltage Ubc between the input b of the monitor electrical cabling 140 and the aforementioned junction point c are equal, to within a predefined potential margin of error (predefined threshold).

The monitoring device 150 furthermore comprises a differential amplifier DIFF 340, connected at a first input to the input b of the monitor electrical cabling 140 and at a second input to the input a of the main electrical cabling 130. The differential amplifier DIFF 340 is arranged for measuring the difference between the electrical potential at the input of the main electrical cabling 130 and the electrical potential at the input of the monitor electrical cabling 140. The difference between these two electrical potentials is supplied at the output d of the differential amplifier DIFF 340. For example, the differential amplifier DIFF 340 is an operational amplifier with a gain $G2=1$, configured as a subtractor, where the first input is the input "−" and the second input is the input "+". The inverse connection of the inputs is also possible as long as the polarity of the voltage Vref is also inverted, or the inputs of the comparator COMP 350 (detailed hereinafter) are inverted.

The monitoring device 150 furthermore comprises a comparator COMP 350, to a first input "−" of which a predefined potential Vref is applied corresponding to the aforementioned predefined potential margin of error, and to a second input "+" of which the output d of the differential amplifier DIFF 340 is connected. A low state at the output e of the comparator COMP 350 indicates a normal operation of the main electrical cabling 130 and a high state at the output e of the comparator COMP 350 indicates an abnormal operation of the main electrical cabling 130, namely a fault in the main electrical cabling 130 having resulted in the formation of a serial arc or an abnormal increase in the connection resistance.

The monitoring device 150 furthermore comprises a control unit CU 370 arranged for monitoring the state, high or low, at the output e of the comparator COMP 350, and for actuating a mechanism for reacting to the detection of fault in the main electrical cabling 130. Preferably, the control unit CU 370 is a trigger for a circuit breaker which is placed upstream of the main electrical cabling 130 in such a manner as to interrupt the electrical power supply via the main electrical cabling 130. A backup electrical power supply then takes over for supplying electrical power to the load L 160, as needed. As a variant or as a complement, the control unit CU 370 includes a communications interface designed to send a warning of the detection of a fault in the main electrical cabling 130, for example, to a dashboard instrument in the cockpit or to an on-board maintenance server.

The monitoring device 150 may furthermore comprise a low-pass filter F 360 at the output e of the comparator COMP 350 (upstream of the control unit CU 370) so as to perform a filtering of any potential electromagnetic interference and to allow the time for the temperature of the electrical cabling to stabilize when the current varies, thus avoiding spurious detections.

Other arrangements of the monitoring device 150 are possible using an electronic circuitry, as long as the appropriate current I2 is injected into the monitor electrical cabling 140 and as long as the comparison and difference measurement functions detailed hereinabove are implemented. For example, the functions carried out by the attenuator ATT 330 and/or the differential amplifier DIFF 340 and/or the comparator COMP 350 and/or the control unit CU 370 may be implemented by virtue of an FPGA (Field-Programmable Gate Array) or an ASIC (Application-Specific Integrated Circuit), a DSP (Digital Signal Processor) or an assembly formed of a microcontroller and a memory storing a computer program comprising instructions causing the implementation by the microcontroller of the functions in question.

Figure 4:
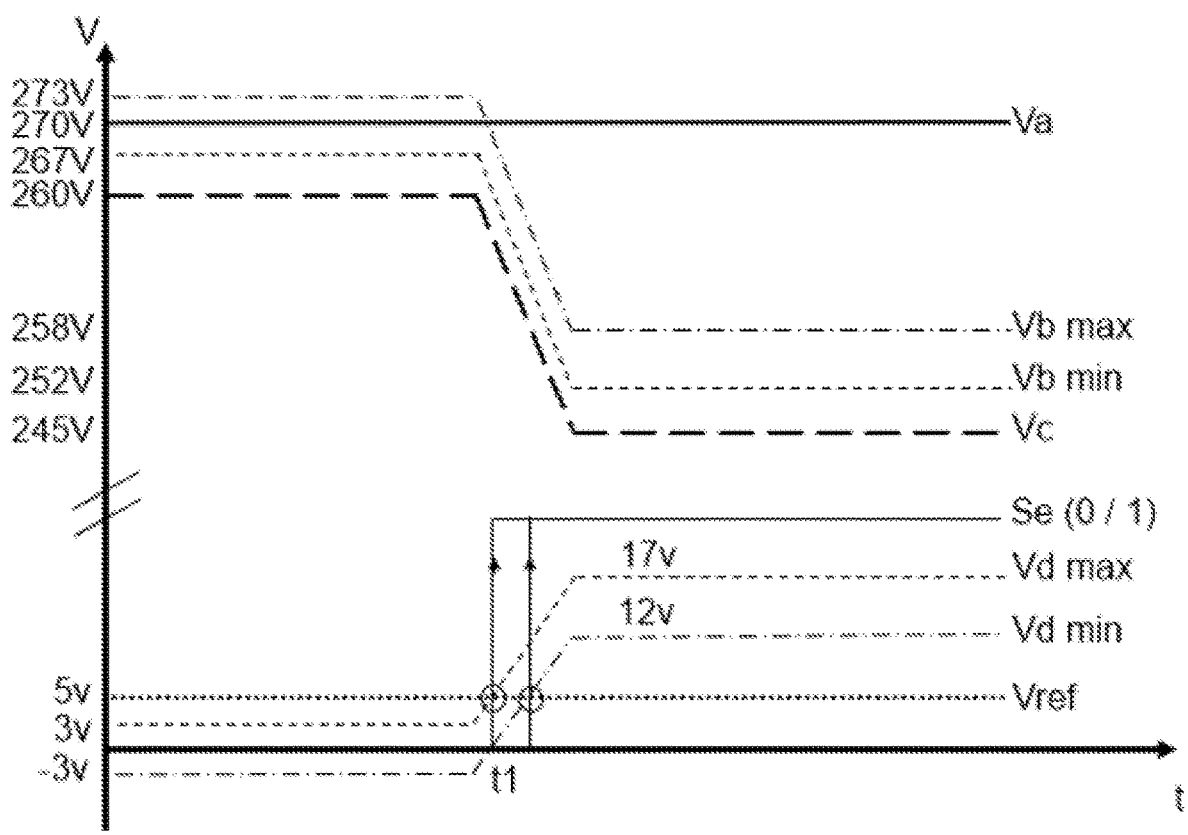
FIG. 4 illustrates variations of electrical potentials over time in the electrical installation according to a first embodiment of the disclosure herein.

FIG. 4 illustrates variations over time of electrical potentials in the electrical installation 110. By way of illustration, it is considered that the cores of the electrical cabling are made of copper, of length 100 meters, that the cross-section S1 is 50 mm$^2$ and that this represents a resistance at +60° C. of 40 mΩ and a voltage Uac of 10 V for a current I1 of 250 A. In addition, it is considered that the cross-section S2 is 0.75 mm$^2$ and that this represents a resistance at +60° C. of 2.67Ω and a voltage Ubc of 10 V for a current I2 of 3.75 A. Considering that the normal difference between Uac and Ubc is ±3 V (in other words that the electrical potential Vb of the input b of the monitor electrical cabling 140 is in the range between a minimum value Vb min and a maximum value Vb max with a difference of 3 V with respect to the electrical potential Va of the input a of the main electrical cabling 130), the value of +Vref is fixed at 5 V. Lastly, it is considered that the occurrence of a fault in the main electrical cabling 130 leads to a voltage drop of 15 V in the framework of an electrical power supply of 270 VDC.

At the time t1, a fault in the main electrical cabling 130 appears, resulting in the formation of a serial arc or an abrupt increase of temperature in a connection. The electrical potential Vc at the junction point c decreases, together with the electrical potential Vb. The formation of a serial arc maintains the potential Va. As a consequence, the potential Vd (in the range between a minimum value Vd min and a maximum value Vd max with a difference between them of 6 V) at the output d of the differential amplifier DIFF 340 increases. By exceeding the threshold defined by Vref, the state Se of the output e of the comparator COMP 350 goes from the low state ("0") to the high state ("1"), which represents the detection of the fault in the main electrical cabling 130.

If the electrical voltage Uac were to vary because of variations in temperature along the main electrical cabling, the voltage Ubc would vary in the same way given that the monitor electrical cabling 140 is installed alongside the main electrical cabling 130 and that the current I2 is adjusted on the current I1. A fault in the main electrical cabling 130 leading to the formation of a serial arc or of an increase in connection resistance, and hence in temperature of this connection, would be detected despite these temperature variations.

The description hereinabove details embodiments based on an electrical generator supplying a positive DC voltage. Adapting them to a generator supplying a negative DC voltage is then trivial for those skilled in the art (direction of the current, connection of the inputs of the differential amplifier DIFF 340 and of the comparator COMP 350, etc.).

In the case of an Alternating Current (AC) voltage generator, the voltages "a" at the output of the electrical source SRC 120 and "b" at the output of the controllable current generator 320 are transformed upstream into RMS (Root Mean Square) values, by for example using a converter or a full-wave rectifier without threshold followed by a low-pass filter, prior to being input into the differential amplifier DIFF 340.

Figure 5:
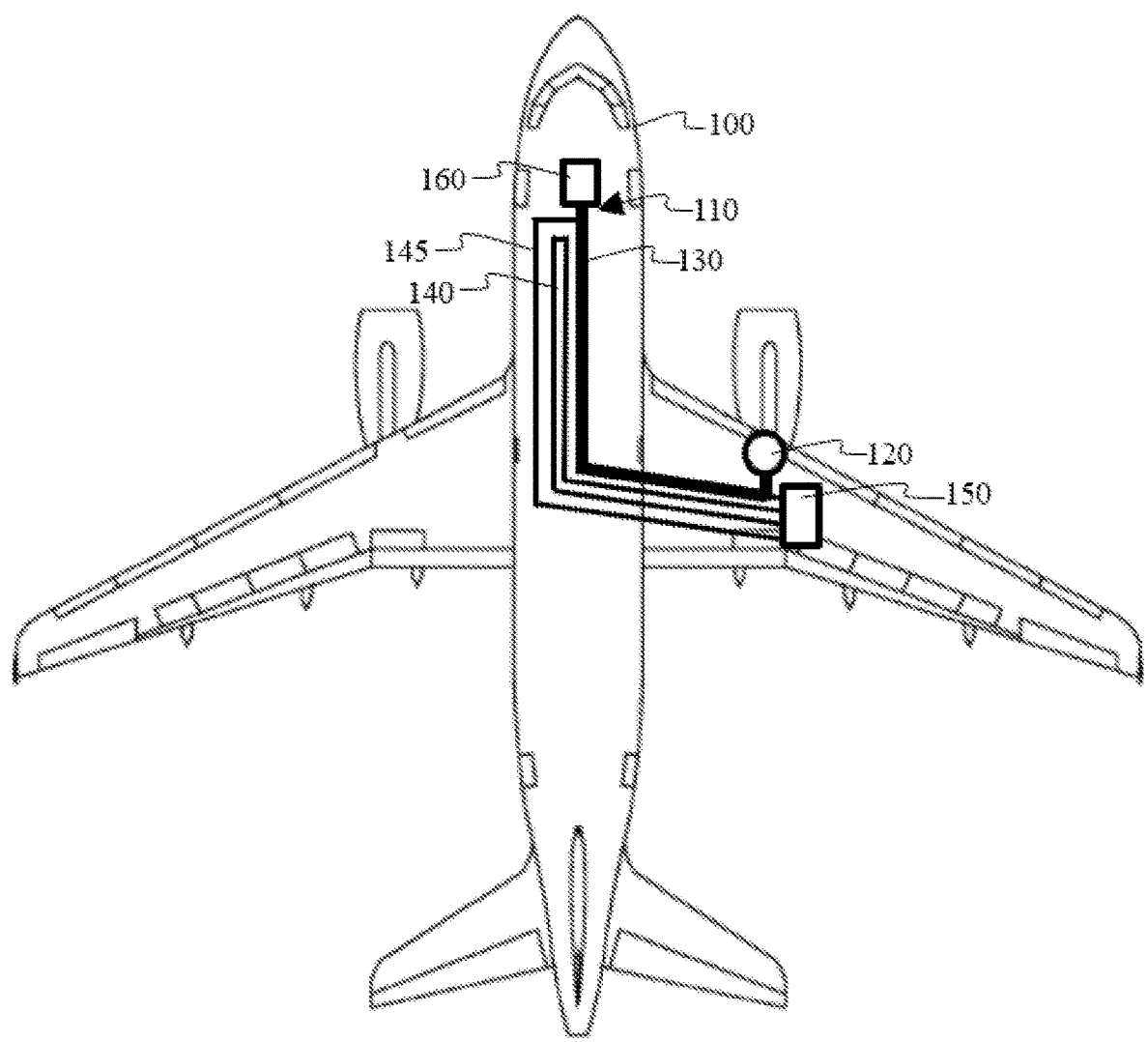
FIG. 5 illustrates schematically, as a top view, an aircraft equipped with an electrical installation comprising a system for detecting faults in electrical cabling according to a second embodiment of the disclosure herein.

FIG. 5 illustrates schematically, as a top view, an aircraft 100 equipped with an electrical installation 110 comprising a system for detecting faults in electrical cabling in the electrical installation 110 according to a second embodiment of the disclosure herein.

The electrical installation comprises an electrical source 120 and an electrical system 160 (typically referred to as load) to be electrically powered by virtue of the electrical source 120. The electrical source 120 and the electrical system 160 are connected by virtue of an electrical cabling 130. The electrical cabling 130 comprises at least one electrical supply cable, and potentially furthermore one or more electrical connections.

The electrical installation 110 is subject to variations in temperature along the electrical cabling 130. It is for example considered that the electrical source 120 is an electrical generator at the output (mechanical sampling) of a turbojet of the aircraft 100 and that the electrical system 160 is an electrical distribution center of the aircraft 100. It is furthermore considered, in this example, that the electrical cabling 130 runs in one of the wings of the aircraft 100, then into the pressurized cabin of the aircraft 100. The electrical cabling 130 thus passes through three regions Z1, Z2, Z3 having different environmental conditions, more particularly in terms of ambient temperature. The region Z1 corresponds to an area of the wing which covers a distance D around the turbojet, the region Z2 corresponds to an area of the wing beyond the distance D, and the region Z3 corresponds to the pressurized cabin of the aircraft 100.

The system for detecting faults in electrical cabling comprises an electrical cabling 140, which runs forward and backward along the electrical cabling 130, between the input of the electrical cabling 130 and the output of the electrical cabling 130, in other words over the portion of electrical cable to be monitored. The electrical cabling 140 thus takes the form of a longilineal loop. The installation of the electrical cabling 140 is then such that the portion of the electrical cabling 140 which connects the forward and the return sections along the electrical cabling 130 is of negligible length with respect to the length of the electrical cabling 130.

The electrical cabling 140 serves as a reference electrical cabling and is thus installed (both the forward and return sections) so as to be subject to the same environmental variations, notably in terms of temperature, as the electrical cabling 130. In the present description, the electrical cabling 130 is called main electrical cable and the electrical cabling 140 is called monitor electrical cabling.

However, the monitor electrical cabling 140 has a cross-section S2 that is smaller than the cross-section S1 of the main electrical cabling 130, thus allowing the weight due to the monitor electrical cabling 140 to be limited. The resistance R2 of the monitor electrical cabling 140 is therefore higher than the resistance R1 of the main electrical cabling 130. This allows the current flowing in the monitor electrical cabling 140 to be much lower than the current flowing in the main electrical cabling 130.

Figure 6:
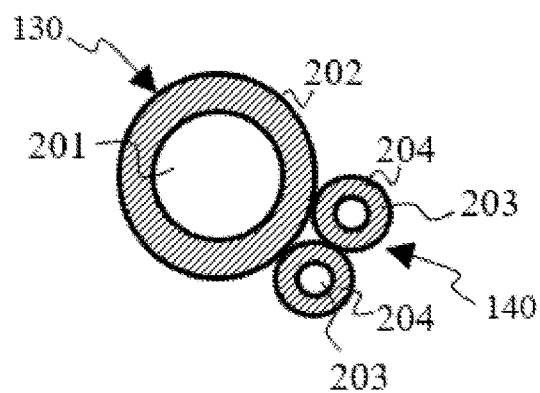
FIG. 6 illustrates schematically a simplified cross-section of one particular arrangement of the electrical cabling in the electrical installation according to a second embodiment of the disclosure herein.

One particular installation of the monitor electrical cabling 140 with respect to the main electrical cabling 130 is shown in FIG. 6. This shows as a simplified cross-section a conducting core 201 (typically made of copper) surrounded by an insulating sheath 202 of the main electrical cabling 130, and a conducting core 203 (typically made of copper) surrounded by an insulating sheath 204 of the monitor electrical cabling 140. In FIG. 6, the monitor electrical cabling 140 is placed, over its forward and return sections, against the main electrical cabling 130, so as to closely match their increase in temperature associated with resistive heating. For this purpose, the monitor electrical cabling 140 may be attached or bonded to the main electrical cabling 130.

The system for detecting faults in electrical cabling furthermore comprises a monitoring device 150 comprising a controllable current generator arranged for injecting at the input of the monitor electrical cabling 140 a current I2 equal to the current I1 attenuated by an attenuation factor G1, the current I1 being injected by the electrical source 120 at the input of the main electrical cabling 130, the controllable current generator being connected between the input and the output of the monitor electrical cabling 140.

The system for detecting faults in electrical cabling furthermore comprises a return cable 145. The return cable 145 brings the electrical potential at the output of the main electrical cabling 130 back to the monitoring device 150, in other words the place where the input and the output of the monitor electrical cabling 140 are located. As explained hereinafter, the return cable 145 is connected to the input of a differential amplifier formed by virtue of an operational amplifier. A weak current, for example of the order of a few microamps, flows in the return cable 145. Therefore, even if the temperature conditions cause the resistance of the return cable to vary, the potential difference between the two ends of the return cable 145 is negligible. For example, if the current in the return cable 145 is 1 μA and if the resistance of the return cable 145 is around 10Ω, the measurement inaccuracy is 10 μV, which is effectively negligible.

The monitoring device 150 is furthermore arranged for determining a difference in voltages between, on the one hand, the voltage between the input and the output of the main electrical cabling 130 and, on the other hand, an adaptation by virtue of a gain G2 of the voltage between the input and the output of the monitor electrical cabling 140, with G2=S2/(2.G1.S1), and for detecting a fault in the main electrical cabling 130 when this difference in voltages goes beyond a predefined margin.

The attenuation factor G1 is such that the currents I1 and I2 respectively result in the same increase in temperature in the main electrical cabling 130 and in the monitor electrical cabling 140. Thus, in the absence of a fault on the main electrical cabling 130, the aforementioned difference in voltages is contained within the predefined margin.

The ratio between the cross-section S1 and the cross-section S2 may thus be defined as a function of a target current I2 in the monitor electrical cabling 140 with regard to an expected current I1 in the main electrical cabling 130. The ratio between the cross-section S1 and the cross-section S2 also preferably takes into account thermal resistance of the insulating sheaths 202 and 204, if they differ. Other parameters may be relevant, such as the alloy used for the conducting cores 201, 203, the configuration of the conducting cores (braiding or otherwise), the range of voltages in use, etc.

In one embodiment, the monitor electrical cabling 140 is of same composition as the main electrical cabling 130. Notably, the electrical cables have conducting cores made of the same alloy. It is then for example possible to choose a cross-section S1 of 50 mm$^2$ for a nominal value of the current I1 of 200 A, and a cross-section S2 of 0.75 mm$^2$ for a nominal value of the current I2 of 15 A.

Figure 7:
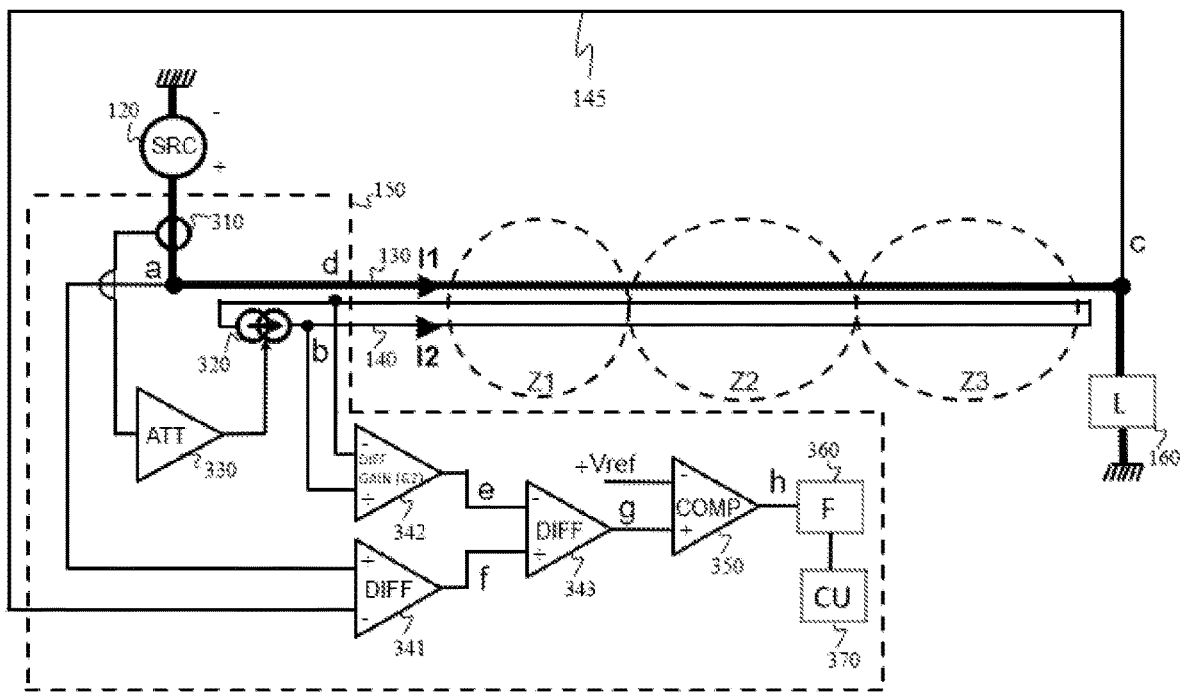
FIG. 7 illustrates schematically an arrangement of the system for detecting faults in electrical cabling in the electrical installation according to a second embodiment of the disclosure herein.

FIG. 7 illustrates schematically one embodiment of the system for detecting faults in electrical cabling, and more particularly of the monitoring device 150. FIG. 7 shows the load L 160 connected to the electrical source SRC 120 by virtue of the main electrical cabling 130. A current I1 flows in the main electrical cabling 130. FIG. 7 also shows the monitor electrical cabling 140 installed, as a return loop, alongside the main electrical cabling 130. Thus, the heat dissipation due to resistive heating is similar in both sets of electrical cabling, and hence as are also the variation of resistance and the resulting voltage drops, as long as there is no fault in the main electrical cabling 130.

The monitoring device 150 comprises a current probe 310 installed just upstream of the input a of the main electrical cabling 130 in order to measure the intensity of the current I1. The monitoring device 150 furthermore comprises an attenuator ATT 330 responsible for controlling a controllable current generator 320 injecting a current I2 into the monitor electrical cabling 140. As shown in FIG. 7, the controllable current generator 320 is connected between the input b and the output d of the monitor electrical cabling 140.

The intensity of the current I2 is defined as a function of the intensity of the current I1 measured by the current probe 310. The attenuator ATT 330 has a gain G1 as defined hereinabove. Thus, the current I2 is such that I2=G1.I1 in the monitor electrical cabling 140.

The monitoring device 150 furthermore comprises a first differential amplifier DIFF 341, connected at a first input to the input a of the main electrical cabling 130 and at a second input to the output c of the main electrical cabling 130, via the return cable 145. The differential amplifier DIFF 341 is arranged for indicating at the output f which value of voltage Uac exists between the input a of the main electrical cabling 130 and the output c of the main electrical cabling 130. In other words, the first amplifier DIFF 341 is arranged for indicating at the output a value of voltage equal to the voltage drop across the terminals of the main electrical cabling 130. The first differential amplifier DIFF 341 is formed by virtue of an operational amplifier with a gain G3=1, where the first input is the input "+" and the second input is the input "−". The inverse connection of the inputs is also possible.

The monitoring device 150 furthermore comprises a second differential amplifier DIFF 342, connected at a first input to the input b of the monitor electrical cabling 140 and at a second input to the output d of the monitor electrical cabling 140. Thus, the second differential amplifier DIFF 342 is arranged for indicating at the output e a value, adapted by virtue of the gain G2, of voltage Ubd between the input b of the monitor electrical cabling 140 and the output d of the monitor electrical cabling 140. For example, the second differential amplifier DIFF 342 is formed by virtue of an operational amplifier with a gain G2=S2/(2.G1.S1), where the first input is the input "−" and the second input is the input "+". The inverse connection of the inputs is also possible.

The monitoring device 150 furthermore comprises a third differential amplifier DIFF 343, connected at a first input to the output e of the second differential amplifier DIFF 342 and at a second input to the output f of the first differential amplifier DIFF 341. The third differential amplifier DIFF 343 is arranged for indicating at the output g which difference exists between the voltage Uac and the voltage Ubd adapted by the gain G2. The third differential amplifier DIFF 343 is for example formed by virtue of an operational amplifier with a gain G4=1, where the first input is the input "−" and the second input is the input "+". The inverse connection of the inputs is also possible.

The monitoring device 150 furthermore comprises a comparator COMP 350, to a first input "+" of which a predefined potential +Vref is applied corresponding to the aforementioned predefined margin, and to a second input "−" of which the output g of the third differential amplifier DIFF 343 is connected. A low state at the output h of the comparator COMP 350 indicates a normal operation of the main electrical cabling 130 and a high state at the output h of the comparator COMP 350 indicates an abnormal operation of the main electrical cabling 130, namely a fault in the main electrical cabling 130 having caused the formation of a serial arc or an increase in the temperature of a connection.

The monitoring device 150 furthermore comprises a control unit CU 370 arranged for monitoring the state, high or low, at the output g of the comparator COMP 350, and for actuating a mechanism for reaction to the detection of a fault in the main electrical cabling 130. Preferably, the control unit CU 370 is a trigger for a circuit breaker which is placed upstream of the main electrical cabling 130 in such a manner as to interrupt the electrical power supply via the main electrical cabling 130. A backup electrical power supply then takes over for supplying electrical power to the load L 160, as needed. As a variant or as a complement, the control unit CU 370 includes a communications interface designed to send a warning of the detection of a fault in the main electrical cabling 130, for example, to a dashboard instrument in the cockpit or to an on-board maintenance server.

The monitoring device 150 may furthermore comprise a low-pass filter F 360 at the output g of the comparator COMP 350 (upstream of the control unit CU 370) in order to carry out a filtering of any potential electromagnetic interference and to allow the time for the temperature of the electrical cabling to stabilize when the current varies, thus avoiding spurious detections.

Other arrangements of the monitoring device 150 are possible using an electronic circuitry. For example, the functions performed by the attenuator ATT 330 and/or the first differential amplifier DIFF 341 and/or the second differential amplifier DIFF 342 and/or the third differential amplifier DIFF 343 and/or the comparator COMP 350 and/or the control unit CU 370 may be carried out by virtue of an FPGA (Field-Programmable Gate Array) or an ASIC (Application-Specific Integrated Circuit), a DSP (Digital Signal Processor) or an assembly consisting of a microcontroller and of a memory storing a computer program comprising instructions causing the implementation by the microcontroller of the functions in question.

Figure 8:
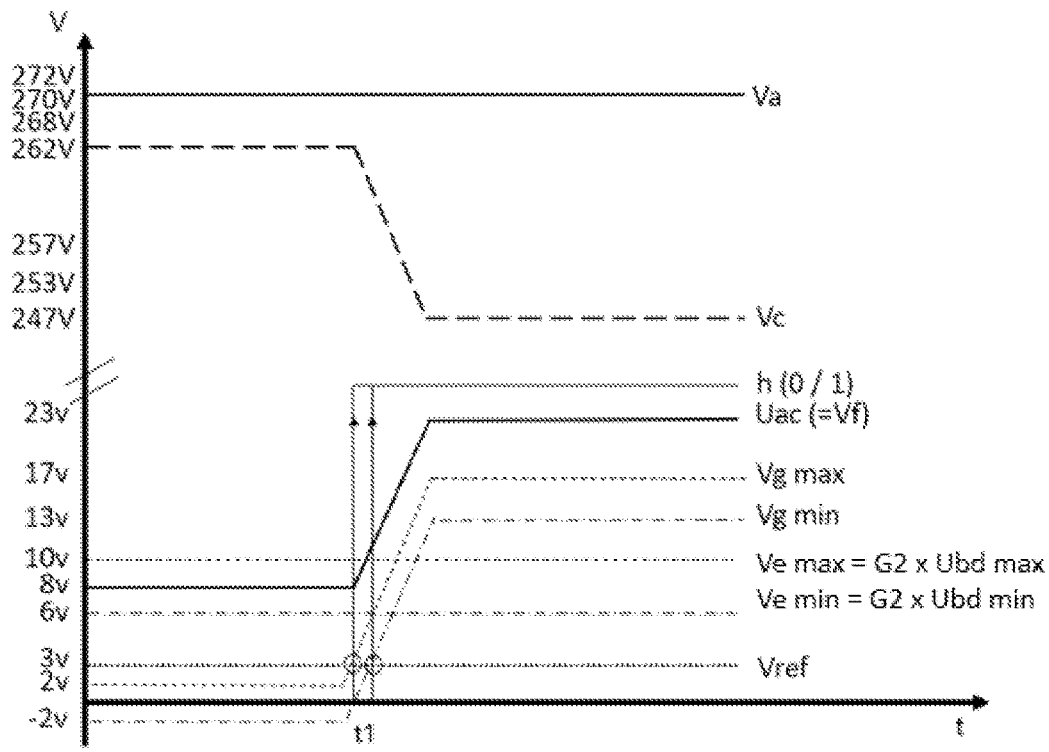
FIG. 8 illustrates variations of electrical potentials over time in the electrical installation according to a second embodiment of the disclosure herein.

FIG. 8 illustrates variations over time of electrical potentials in the electrical installation 110. By way of illustration, it is considered that the cores of the sets of electrical cabling are made of copper. It is furthermore considered that the length of the main electrical cabling 130 is 100 meters, with a cross-section S1 of 50 mm$^2$, and that this represents a resistance at +60° C. of 40 mΩ. By considering a nominal current I1 of 200 A, this results in a nominal voltage Uac of 8 V. In addition, it is considered that the length of the monitor electrical cabling 140 is 200 meters, with a cross-section S2 of 0.75 mm$^2$, and that this represents a resistance at +60° C. of 5.33Ω. The nominal voltage Ubd is then 80 V, G1=0.075 and G2=0.1. Considering that the normal difference between Uac and G2.Ubd (in other words the value at the output e of the second differential amplifier DIFF 342) is ±2 V, the value of Vref is fixed at 3 V. It is lastly considered that the occurrence of a fault in the main electrical cabling 130 results in a voltage drop of 15 V in the framework of an electrical power supply of 270 VDC.

At the time t1, a fault in the main electrical cabling 130 appears, leading to the formation of a serial arc or an abrupt increase of temperature in a connection. The electrical potential Vc at the output c of the main electrical cabling 130 decreases, together with the electrical potential Vb at the input b of the monitor electrical cabling 140. The formation of a serial arc maintains the electrical potential Va at the input of the main electrical cabling 130. As a consequence, the voltage Uac increases, which increases the voltage at the output g of the third differential amplifier DIFF 343. When the voltage at the output g of the third differential amplifier DIFF 343 exceeds Vref, the state Sh of the output h of the comparator COMP 350 goes from the low state ("0") to the high state ("1"), which represents the detection of the fault in the main electrical cabling 130 and of the formation of a serial arc.

If the electrical voltage Uac were to vary because of variations in temperature along the main electrical cabling, the voltage Ubd would vary in the same way given that the monitor electrical cabling 140 is installed alongside the main electrical cabling 130 and that the current I2 is adjusted on the current I1. As far as the variation of electrical potential along the return cable 145 is concerned, this would be negligible. A fault in the main electrical cabling 130 resulting in the formation of a serial arc or an increase in connection resistance would be detected despite these variations in temperature.

The description hereinabove details embodiments based on an electrical generator supplying a positive DC voltage. Adapting them to a generator supplying a negative DC voltage is then trivial for those skilled in the art (direction of the current, connection of the inputs of the differential amplifiers DIFF and of the comparator COMP 350, etc.).

In the case of an AC voltage generator, the voltages "e" at the output of the differential amplifier DIFF 342 and "f" at the output of the differential amplifier DIFF 341 are transformed upstream into RMS (Root Mean Square) values by, for example, using a converter or a full-wave rectifier without threshold followed by a low-pass filter, prior to being fed into the differential amplifier DIFF 343.

The subject matter disclosed herein can be implemented in or with software in combination with hardware and/or firmware. For example, the subject matter described herein can be implemented in software executed by a processor or processing unit. In one exemplary implementation, the subject matter described herein can be implemented using a computer readable medium having stored thereon computer executable instructions that when executed by a processor of a computer control the computer to perform steps. Exemplary computer readable mediums suitable for implementing the subject matter described herein include non-transitory devices, such as disk memory devices, chip memory devices, programmable logic devices, and application specific integrated circuits. In addition, a computer readable medium that implements the subject matter described herein can be located on a single device or computing platform or can be distributed across multiple devices or computing platforms.

While at least one example embodiment of the invention (s) is disclosed herein, it should be understood that modifications, substitutions and alternatives may be apparent to one of ordinary skill in the art and can be made without departing from the scope of this disclosure. This disclosure is intended to cover any adaptations or variations of the example embodiment(s). In addition, in this disclosure, the terms "comprise" or "comprising" do not exclude other elements or steps, the terms "a", "an" or "one" do not exclude a plural number, and the term "or" by either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A detection system for detecting, in a direct current (DC) electrical installation, a fault in a main electrical cabling having a cross-section, the main electrical cabling installed such that the main electrical cabling is subject to variations in ambient temperature over its length, the detection system comprising:
a monitor electrical cabling for placement alongside the main electrical cabling, the monitor electrical cabling having a same length as the main electrical cabling, a same composition as the main electrical cabling, and a cross-section that is less than the cross-section of the main electrical cabling, the monitor electrical cabling running along and being placed against the main electrical cabling;
a controllable current generator configured for injecting, at an input of the monitor electrical cabling, a monitor electrical current that is substantially equal to a product of a main electrical current flowing through the main electrical cabling multiplied by an attenuation gain equal to a ratio of the cross-section of the monitor electrical cabling to the cross-section of the main electrical cabling, the main electrical cabling and the monitor electrical cabling being joined at an output of the main electrical cabling; and
a monitoring device in a form of an electronic circuitry configured for measuring a difference between a first electrical potential, measured at an input of the main electrical cabling, and a second electrical potential, measured at the input of the monitor electrical cabling, to detect the fault in the main electrical cabling when the difference between the first electrical potential and the second electrical potential exceeds a predefined threshold.

2. The detection system according to claim 1, comprising a current probe configured for measuring an intensity of the main electrical current, wherein the electronic circuitry comprises:
an attenuator configured for controlling the controllable current generator as a function of the intensity of the main electrical current measured by the current probe;
a differential amplifier configured for measuring the difference between the first electrical potential and the second electrical potential; and
a comparator configured for comparing an output of the differential amplifier with a predefined electrical potential corresponding to the predefined threshold.

3. The detection system according to claim 1, comprising a low-pass filter at an output of the comparator.

4. An electrical installation comprising:
a main electrical cabling for installation in an environment where the main electrical cabling is subject to variations in ambient temperature over its length, the main electrical cabling having a cross-section; and
a detection system configured for detecting a fault in the main electrical cabling and comprising:
a monitor electrical cabling having a same composition as the main electrical cabling and a cross-section that is less than the cross-section of the main electrical cabling;
a controllable current generator configured for injecting, at an input of the monitor electrical cabling, a monitor electrical current that is substantially equal to a product of a main electrical current flowing through the main electrical cabling multiplied by an attenuation gain equal to a ratio of the cross-section of the monitor electrical cabling to the cross-section of the main electrical cabling, the main electrical cabling and the monitor electrical cabling being joined at an output of the main electrical cabling; and
a monitoring device in a form of an electronic circuitry configured for measuring a difference between a first electrical potential, measured at an input of the main electrical cabling, and a second electrical potential, measured at the input of the monitor electrical cabling, to detect the fault in the main electrical cabling when the difference between the first electrical potential and the second electrical potential exceeds a predefined threshold.

5. The electrical installation according to claim 4, wherein the monitor electrical cabling is placed, over its length, against the main electrical cabling.

6. The electrical installation according to claim 4, comprising a circuit breaker, wherein the electronic circuitry is arranged for triggering the circuit breaker when the difference between the first electrical potential and the second electrical potential exceeds the predefined threshold.

7. An aircraft comprising an electrical installation according to claim 4, wherein the main electrical cabling is installed in areas of the aircraft subject to different ambient temperatures.

8. The aircraft according to claim 7, wherein the main electrical cabling is installed between an electrical generator, which is installed on a wing of the aircraft at an outlet of a turbojet, and an electrical distribution center, which is installed in a pressurized cabin of the aircraft.

* * * * *